US006998348B2

(12) United States Patent
Ciovacco et al.

(10) Patent No.: US 6,998,348 B2
(45) Date of Patent: Feb. 14, 2006

(54) METHOD FOR MANUFACTURING ELECTRONIC CIRCUITS INTEGRATED ON A SEMICONDUCTOR SUBSTRATE

(75) Inventors: Francesco Ciovacco, Milan (IT); Simone Alba, Milan (IT); Roberto Colombo, Lentate sul Seveso (IT); Chiara Savardi, Brescia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/428,338

(22) Filed: May 1, 2003

(65) Prior Publication Data

US 2004/0029307 A1    Feb. 12, 2004

(30) Foreign Application Priority Data

May 2, 2002    (IT)    ............... MI2002A0931

(51) Int. Cl.
H01L 21/302    (2006.01)
H01L 21/461    (2006.01)

(52) U.S. Cl. ............ 438/706; 438/696; 438/712; 438/713

(58) Field of Classification Search ............ 438/706, 438/712, 689, 694, 695, 696, 713
See application file for complete search history.

(56) References Cited

U.S. PATENT DOCUMENTS

| | | | | |
|---|---|---|---|---|
| 4,589,952 A | * | 5/1986 | Behringer et al. | 216/2 |
| 4,814,041 A | * | 3/1989 | Auda | 438/712 |
| 5,525,542 A | * | 6/1996 | Maniar et al. | 438/669 |
| 5,716,494 A | | 2/1998 | Imai et al. | 156/643.1 |
| 5,910,453 A | | 6/1999 | Gupta et al. | 438/717 |
| 5,994,228 A | * | 11/1999 | Jeng et al. | 438/698 |
| 6,028,001 A | | 2/2000 | Shin | 438/640 |
| 6,040,247 A | | 3/2000 | Chung | 438/713 |
| 6,235,214 B1 | | 5/2001 | Deshmukh et al. | 216/67 |
| 6,326,307 B1 | * | 12/2001 | Lindley et al. | 438/689 |
| 6,326,312 B1 | | 12/2001 | Kim | 438/696 |
| 6,329,109 B1 | * | 12/2001 | Figura et al. | 430/11 |
| 6,329,292 B1 | * | 12/2001 | Hung et al. | 438/706 |
| 6,524,875 B1 | * | 2/2003 | Figura et al. | 438/46 |
| 6,620,575 B1 | * | 9/2003 | Kim et al. | 430/314 |

(Continued)

FOREIGN PATENT DOCUMENTS

| | | |
|---|---|---|
| EP | 0 871 213 A2 | 10/1998 |
| EP | 1 041 613 A1 | 10/2000 |
| WO | WO 01/31697 A1 | 5/2001 |

OTHER PUBLICATIONS

M. Pons et al., Jpn. J. Appl. Phys. part 1, 33 (2), 991, 1994.*

(Continued)

*Primary Examiner*—Alexander Ghyka
(74) *Attorney, Agent, or Firm*—Lisa K. Jorgenson; Dennis M. de Guzman; Seed IP Law Group PLLC

(57) ABSTRACT

A method for manufacturing semiconductor-integrated electronic circuits includes: depositing an auxiliary layer on a substrate; depositing a layer of screening material on the auxiliary layer; selectively removing the layer of screening material to provide a first opening in the layer of screening material and expose an area of the auxiliary layer; and removing this area of the auxiliary layer to form a second opening in the auxiliary layer, whose cross-section narrows toward the substrate to expose an area of the substrate being smaller than the area exposed by the first opening.

10 Claims, 4 Drawing Sheets

U.S. PATENT DOCUMENTS

| | | | |
|---|---|---|---|
| 6,693,038 B1 * | 2/2004 | Shen | 438/700 |
| 6,699,792 B1 * | 3/2004 | Wang et al. | 438/696 |
| 6,716,763 B1 * | 4/2004 | Li et al. | 438/711 |
| 2001/0024769 A1 | 9/2001 | Donoghue et al. | 430/329 |
| 2002/0175414 A1 * | 11/2002 | Teh et al. | 257/751 |

OTHER PUBLICATIONS

O. Joubert et al. SPIE, vol. 1803, 130 (1992).*

Moreau, Wayne, Semiconductor Lithography, Plenum, 1988, pp. 631-638, 690-693, 715-717, 724-738.*

* cited by examiner

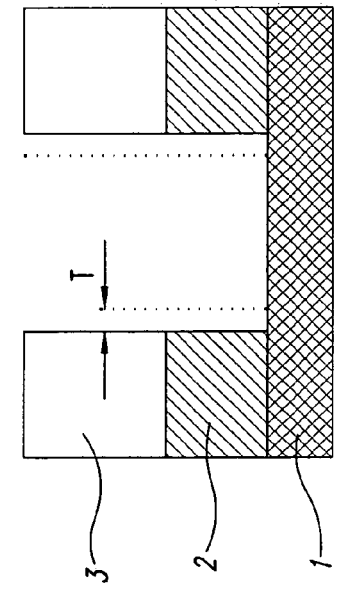
FIG. 1 (Prior Art)
FIG. 2 (Prior Art)
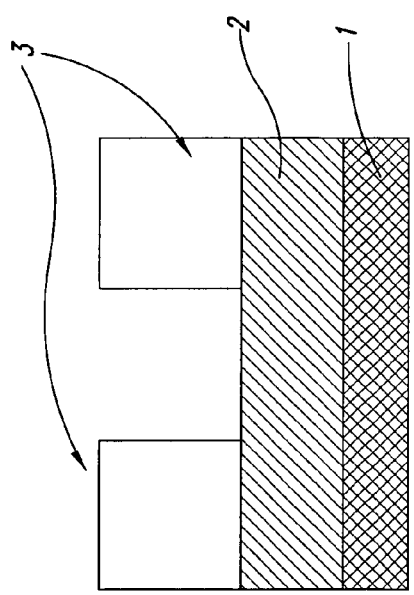
FIG. 3 (Prior Art)
FIG. 4 (Prior Art)
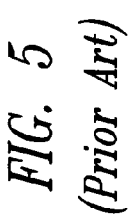
FIG. 5 (Prior Art)

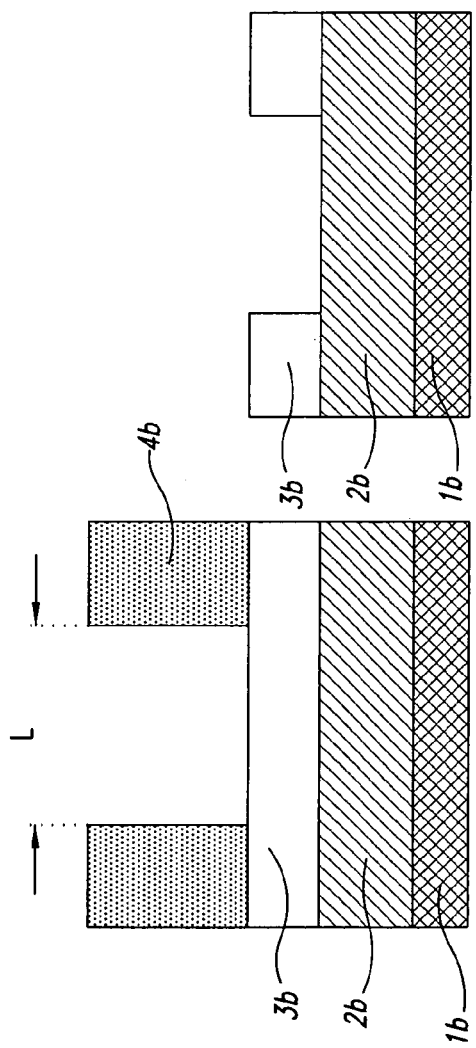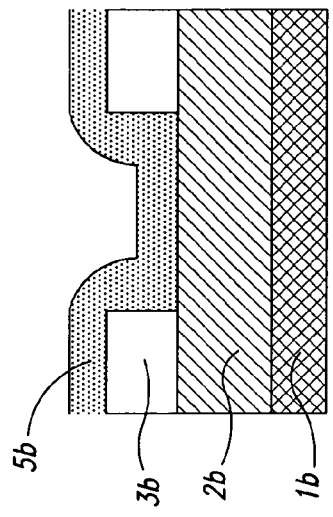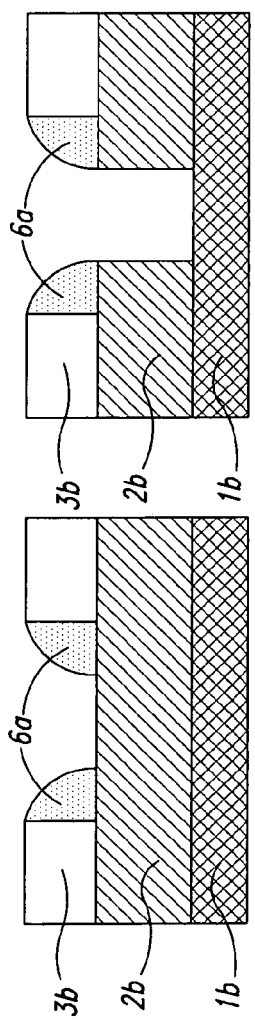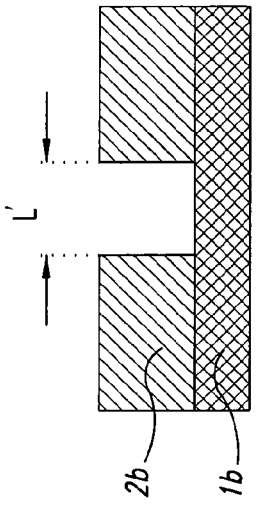
FIG. 6 (Prior Art)
FIG. 7 (Prior Art)
FIG. 8 (Prior Art)
FIG. 9 (Prior Art)
FIG. 10 (Prior Art)
FIG. 11 (Prior Art)

METHOD FOR MANUFACTURING ELECTRONIC CIRCUITS INTEGRATED ON A SEMICONDUCTOR SUBSTRATE

BACKGROUND OF THE INVENTION

1. Field of the Invention

The present disclosure relates to a method for manufacturing electronic circuits integrated on a semiconductor substrate.

The disclosure further relates to a method for manufacturing semiconductor-integrated electronic circuits comprising:

depositing an auxiliary layer on a substrate;

depositing a layer of screening material on said auxiliary layer;

selectively removing said layer of screening material to provide a first opening in said layer of screening material and expose an area of said auxiliary layer.

In particular, though not limited to, the disclosure relates to a method for defining circuit structures of submicron size, wherein the distance between two or more of them is smaller than the distance provided by a conventional photolithographic process and the following description refers to this field of application for convenience of explanation only.

2. Description of the Related Art

As it is well known, one of the basic technological steps for manufacturing integrated circuits is that of transferring some geometries defined by a photosensitive layer (photoresist) on one or more underlying layers: this process is generally called etching step of the layer to be defined.

It is also known how microelectronics has been subjected for years to a general trend providing a continuous size reduction of the various circuit structures forming the integrated circuit. As the size in the photosensitive layers is critical, the different layer etching step has to reproduce sizes without distortions, i.e., the underlying material has to be etched only along a direction being perpendicular to the substrate.

With reference in particular to FIGS. 1 and 2, a portion of a semiconductor electronic circuit is shown, comprising a semiconductor substrate 1 on which a layer 2 of a material to be defined is formed. A layer 3 of photosensitive material is deposited on the layer 2 of material to be defined, and is then selectively removed by using a conventional photolithographic technique so as to expose the areas of the layer 2 to be defined etched. An anisotropic etching is used for the purpose, wherein the wafer in which the electronic device has to be integrated is subjected to a flow of plasma (low-pressure ionized gas). A complex chemio-physical process allows to obtain a process where the lengthwise etching component is absolutely predominating over the transversal T one.

Some methods have been studied to obtain circuit structures being smaller than those obtained through a photolithographic process.

A first prior art solution for obtaining circuit structures in the substrate whose cross-dimension after the etching step is different from that of the photosensitive layer, or anyway allowing to obtain in a layer some circuit structures being smaller than those attainable through a conventional photolithographic process, is illustrated by FIGS. 3 to 5. The method, called Resist trimming, is used for forming a circuit structure, typically of polycrystalline silicon, which has a cross-dimension much smaller than that of the corresponding photosensitive layer.

In particular, a layer 2a of a material to be defined is formed on a semiconductor layer 1a. This is followed by a layer of a photosensitive material being deposited and then selectively removed through conventional photolithographic techniques, as shown in FIG. 3, to produce a strip 3a of width S. A heavily isotropic etching step is then carried out on the strip 3a. This etching step then thins the strip 3a sideways as shown in FIG. 4, so that, after etching, the strip 3a exhibits a smaller width S' than its original width S. The photosensitive layer strip 3a is then etched anisotropically to define a strip 2a' in the underlying material layer 2a of width S'.

Although advantageous into many respects, this first solution only allows the size of a lithographed structure to be reduced, but it is not suitable to reduce the distance between two or more structures.

Another solution, employed for providing an opening between two or more adjacent circuit structures rather than for reducing the size of a circuit structure, comprises forming spacers (Spacers formation).

As shown in FIGS. 6 to 11, a layer 2b of a material to be defined and a layer 3b of auxiliary material are formed on a semiconductor substrate 2b. A layer 4b of a photosensitive material is then deposited to permit a selective action by the layer 3b of auxiliary material and provide a first window having dimension L.

A layer 5b is then deposited for defining spacers 6a that are effective to reduce the cross-dimension of the window previously made in the layer 3b, thus reducing the exposed area of the layer 2b to be defined.

The layer 2b is then etched anisotropically to make a second window L' of a smaller size than the lithographic starting one.

While being advantageous from various points of view, this method for manufacturing spacers narrowing a window previously defined by lithography, has some drawbacks because of the complex circuit architecture made of a succession of depositions and etchings (both isotropic and anisotropic).

In particular, the large number of depositions and etchings greatly worsen the final defect rate of the circuit structure to be realized. In general, particle contaminations deteriorate and heavily worsen the electric characteristics of an integrated circuit. This contamination is partly in the atmosphere, but it is introduced, to a great extent, during each of the process steps for manufacturing the integrated device (masking, depositing, cleaning, etching, etc.).

In addition, the precision with which the width of the spacers can be controlled has strict limits. Actually the spacer dimensions depend on the characteristics of the previous and following steps with respect to the their formation (thickness of the layers used, duration of wet etching, etc.). Accordingly, the accuracy of dimensional control after opening the second window is likely to drop to unsatisfactory levels.

Furthermore, manufacturing costs grow in proportion to the number of operations involved.

BRIEF SUMMARY OF THE INVENTION

The solving idea on which an embodiment of this invention is based is that of providing an opening in an auxiliary layer formed on a substrate, the opening having flared sidewalls. The following vertical etching of the underlying substrate is thus masked by the flared sidewalls of the opening in the auxiliary layer. The cross-dimension of the exposed substrate surface are therefore smaller than the dimension of the top edge of the opening in the auxiliary layer. In this way, an opening can be provided in the substrate underlying the auxiliary layer being narrower than that obtained thorough a conventional photolithographic technique.

On the basis of this idea, the technical problem is solved by one embodiment of a method as previously indicated and wherein the method further comprises the following:

removing said area of said auxiliary layer to form a second opening in said auxiliary layer, whose section narrows towards said substrate to expose a smaller area of said substrate than the area exposed by the first opening.

The features of the method of this invention should be more clearly understood from the following description of an embodiment thereof, given by way of non limitative example with reference to the accompanying drawings.

BRIEF DESCRIPTION OF THE SEVERAL VIEWS OF THE DRAWINGS

In the drawings:

FIGS. 1 and 2 are cross-sections of a portion of an integrated circuit depicted through successive steps of a first manufacturing method according to the prior art;

FIGS. 3, 4 and 5 are cross-sections of a portion of an integrated circuit depicted through successive steps of a second manufacturing method according to the prior art;

FIGS. 6 to 11 are cross-sections of a portion of an integrated circuit depicted through successive steps of a third manufacturing method according to the prior art;

DETAILED DESCRIPTION OF THE INVENTION

Embodiments of a method for manufacturing electronic circuits integrated on a semiconductor substrate are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The process steps hereinafter described are not exhaustive of an integrated circuit manufacturing process. The invention can be implemented along with conventional integrated circuit manufacturing techniques, and only those conventional steps necessary for an understanding of the invention will be described.

The cross-sectional views of portions of an integrated circuit while being manufactured have not been drawn to scale but so as to emphasize major features of the invention.

To address one of the underlying technical problems of the prior art, an embodiment of this invention provides a method for transferring a lithographic pattern onto a layer directly underneath, such that an opening can be made in a substrate to be defined that is much smaller than the opening obtained through a conventional lithographic technique, thus overcoming prior art limits.

Figure 14:
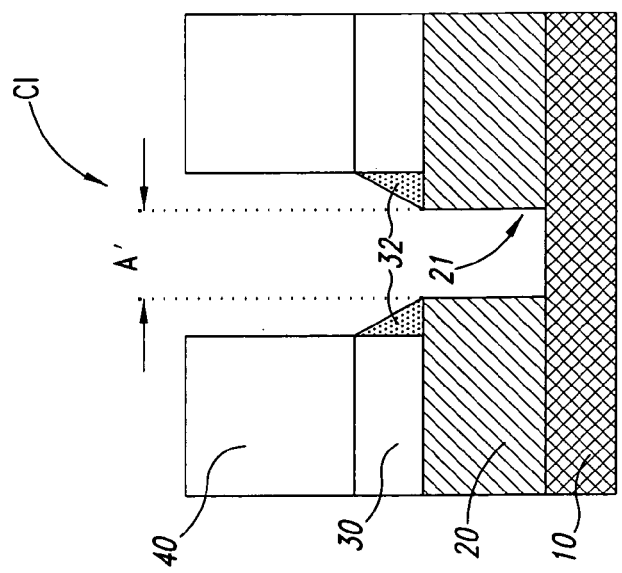
FIGS. 12, 13 and 14 are cross-sections of a portion of an integrated circuit depicted through successive steps of a manufacturing method according to an embodiment of the invention.
Figure 13:
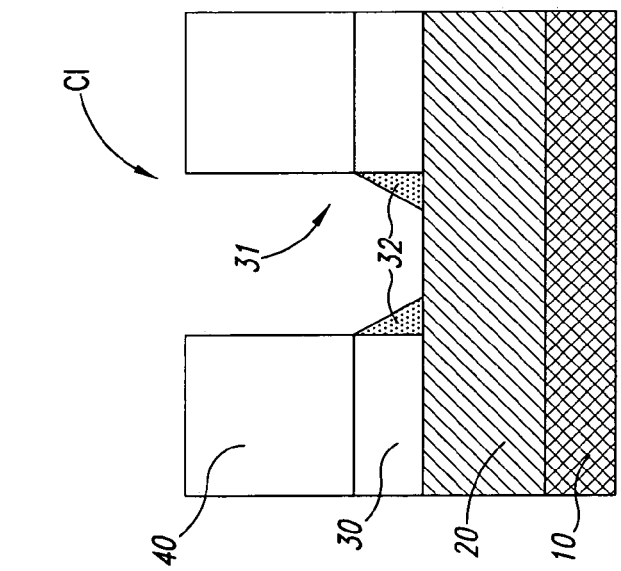
Figure 12:
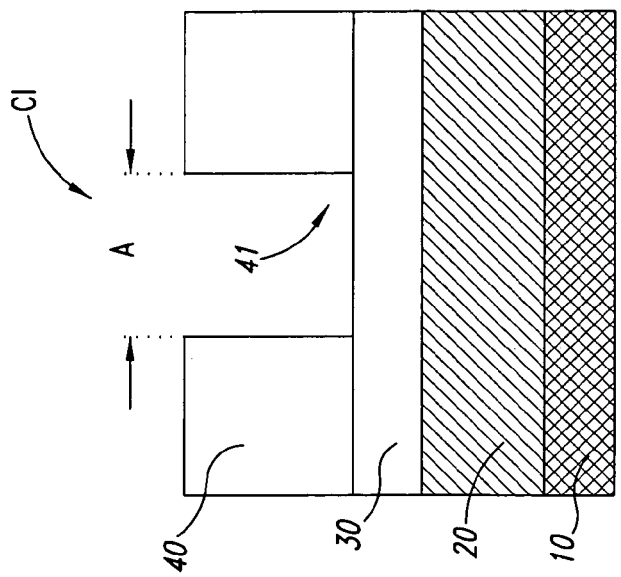

Referring to FIGS. 12 to 14, an integrated circuit CI is shown which has a multi-layer circuit structure comprising of a first layer 10, e.g., a semiconductor substrate; a substrate 20 or other layer to be defined; an auxiliary layer 30; and a layer of a screening material, e.g., a photosensitive material 40.

The word "substrate" is here used to indicate any layer which supports or underlies another material layer. The substrate may be of silicon, polysilicon, metal, or dielectric.

In the method of one embodiment of this invention, the layer of photosensitive material 40 is selectively removed through conventional photolithographic techniques to form a first opening 41 having a first width A.

According to an embodiment of the invention, the auxiliary layer 30 is then anisotropically etched to make an opening 31 with sloping sidewalls, viz., an opening 31 whose vertical section width is not constant and decreases while getting near the substrate 20.

The opening 31 thus has flared sidewalls, i.e., an inverted trapezium-like shaped cross-section.

Although the sidewalls are perfectly straight as shown in the drawings, the walls can be slightly concave or convex as well as irregular or step-like.

Thus, subsequent etching of the substrate 20 to be defined is then screened by the flared sidewalls of the opening 31 in the auxiliary layer 30, reducing cross dimension of the etching surface as well as the cross-dimension A' of the opening 21 which is then formed in the substrate 20 to be defined.

The method of an embodiment of the invention is implemented through chemical etching allowing to obtain a greatly sloping profile of the sidewalls of the opening 31 in the auxiliary layer 30. The following vertical etching of the substrate 20 to be defined is thus masked by the flared sidewalls of the opening 31 in the auxiliary layer 30, the sidewalls being flared, and thus reducing the cross-dimension of the exposed surface at the etching step of the substrate to be defined.

The flare of the sidewalls of the opening 31 can be achieved by using chemical plasma etching, wherein an etching component of the auxiliary layer 30 co-exists with a microdeposition component of the various auxiliary layer etching compounds. The microdeposition component deposits—on the vertical walls of the opening being formed progressively in the auxiliary layer 30 by means of the etching component—a layer of a so-called polymeric material, thus narrowing the etching area. In this way while the auxiliary layer 30 is being etched, spacers 32 made of this polymeric material are formed in the opening 31 and produce the flared sidewalls.

In particular, on the vertical side surfaces of the opening 31, the deposition speed of polymer has to be higher than that of etching the auxiliary layer 30, so that the etching direction is leaned with respect to the surface of the substrate 20 and the spacers 32 are formed.

In one embodiment of the method of the invention, the ratio between the deposition speed of the polymer on the sidewalls and the etching speed along the lengthwise direction (together with the thickness of the auxiliary layer 30) allows to determine the narrowing of the opening 31, i.e., the inclination of the sidewalls of the opening 31 formed by the spacers 32 and the shape of these sidewalls.

In particular, the above ratio may be changed during the auxiliary layer etching step so that the sidewalls of the opening 31 are not perfectly straight but concave or convex.

In an embodiment of the invention, the auxiliary layer 30 is an organic layer, e.g., of the polymer type.

In a modified embodiment of the inventive method, the auxiliary layer 30 comprises an organic material layer known as BARC (Bottom Anti-Reflection Coating). This BARC layer inhibits exposure of the photosensitive layer 40 (resist) to "back" radiation, i.e., radiation being reflected from the substrate, which would harm the quality of the lithographic definition. The thickness of the BARC layer is of 300 to 1500 Å, and its chemical structure is the same as that of a photosensitive layer, except that it undergoes no alterations while being exposed. Thus, during the auxiliary layer 30 etching, the BARC layer acts as an added layer, to be etched before the substrate 20 to be defined can be etched; it is then automatically removed automatically as the photosensitive layer (resist) is removed.

In one embodiment, the step of etching the auxiliary layer 30, whether a BARC or another organic material layer, is carried out by using a plasma which comprises a $CF_4/CH_2F_2/O_2$ solution.

In particular, the $CH_2F_2$ component forms the deposition component for the spacers 32, and the $CF_4/O_2$ solution forms the auxiliary layer 30 removing component.

In one embodiment of the manufacturing method of the invention, $O_2$ concentration varies between 10 sccm and 50 sccm (standard cubic centimeters); $CH_2F_2$ concentration between 10 sccm and about 200 sccm; and $CF_4$ concentration is about 30 sccm. Pressure is within the range of 5 mt to 15 mt (milliTorrs) and temperature in the range of 0° to 80° C. As said before, during the etching step, the $CH_2F_2$ deposition component deposits a polymer onto the sidewalls of the opening 31, thus forming the spacers 32 and narrowing the cross-section of the opening 31.

In an embodiment, the spacers are formed with highly selective materials with respect to the substrate 20, so that the size of the opening 31 can be retained through the next step of etching of the substrate 20.

In fact consumption of the spacers 32, and so of the sidewalls of the opening 31, during the substrate 20 etching would lead, because of the flared opening 31 shape, to a gradual increase of the exposure cross-dimension of the substrate 20, thus causing a not perfectly vertical shape or anyway distorted.

There is no reason, however, why the method of an embodiment of the invention could not be implemented by using polymerizing gases different from $CH_2F_2$, such as $CHF_3$ or other.

The method of one embodiment of the invention can be used to form the floating gate region of a flash memory cell and all circuit structures being highly thickened in the circuit layout.

In particular, through the method of one embodiment of the invention, a cross-dimension of the opening 21 in the substrate 20 can be obtained and be greatly reduced if compared to the size of the opening 41 provided in the photosensitive layer 41.

The cross-dimension A' of the opening 21 provided in the substrate 20 by the method of an embodiment of the invention may be at least 80% smaller than the cross-dimension A of the opening 41 of the photosensitive layer 40.

As an example, assuming a width A of 100 nm, the width A' may be 80 nm or less when the method of one embodiment of the invention is used, according to the formula A'<0.8 A.

Figure 16:
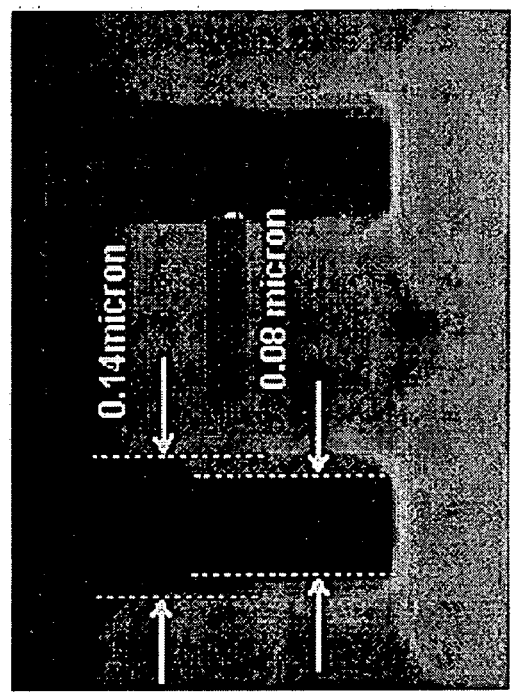
FIGS. 15 and 16 are SEM micrographs of semiconductor devices as manufactured according to an embodiment of a method of the invention.
Figure 15:
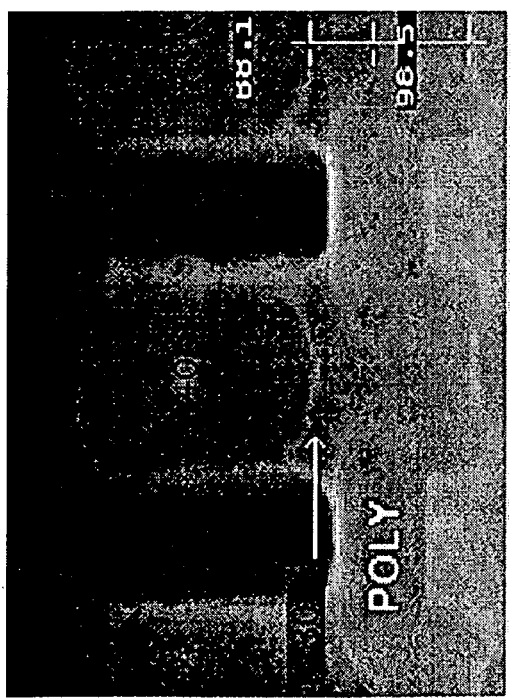

Tests carried out by the Applicants have shown that openings made with the method of an embodiment of the invention, e.g., among the floating gate regions of flash memory cells, allow to achieve a reduction in cross-dimension of 60 to 70 nm with respect to conventional techniques, as illustrated in FIGS. 15 and 16.

These drawings show that a size of 0.14 μm of the opening made in the photosensitive layer drops to a size of 0.08 μm of the exposed area of the polysilicon layer.

In conclusion, the embodiments of the method of this invention have a number of advantages over the prior art.

For example, one embodiment of the method of the invention is a comprehensive method in the sense that it can be applied to any circuit structure to be defined as STI structures or floating gate regions, for any kind of substrate (insulating or conductive), by introducing in the photolithographic process an auxiliary layer, such as an organic anti-reflection layer.

Unlike conventional methods which are based on a sequence of depositing and etching steps, the method of one embodiment of the invention comprises a single conventional plasma etching step, thus lowering the rate of probable defects in the manufacturing process.

Moreover, by changing certain parameters of the plasma employed to etch the substrate to be defined, the width, and hence the narrowing, of the exposed area of the layer to be defined can be adjusted.

Finally, embodiments of the method of the invention keep manufacturing costs below those of current methods by reducing the number of steps to be carried out.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for manufacturing semiconductor-integrated electronic circuits comprising:
   depositing an auxiliary layer onto a substrate;
   depositing a layer of a screening material onto said auxiliary layer;

selectively removing said layer of screening material to provide a first opening in said layer of screening material and expose an area of said auxiliary layer;

removing said area of said auxiliary layer to form a second opening having sidewalls in said auxiliary layer, the second opening having a cross-section that narrows toward said substrate so that an area of said substrate is exposed, the exposed area of the substrate being smaller than the area exposed by the first opening, wherein forming said second opening in said auxiliary layer includes removing said auxiliary layer and simultaneously forming spacers effective to form the sidewalls of said second opening, wherein said auxiliary layer is removed through an anisotropic plasma etching including a component for removing said auxiliary layer and a component for micro-depositing said spacers, wherein said anisotropic plasma etching comprises using a $CF_4/CH_2F_2/O_2$ etching plasma; and using the sidewalls of the second opening to mask a vertical etching of the exposed area of the substrate, while substantially retaining a size of the second opening.

2. A method according to claim 1 wherein said $CF_4/CH_2F_2/O_2$ etching plasma comprises a deposition component having $CH_2F_2$ and an etching component regulated by $CF_4$ and $O_2$.

3. A method according to claim 1 wherein a width of the exposed area of said substrate through said second opening in said auxiliary layer is 80% smaller than a width of said first opening in said layer of screening material.

4. A method according to claim 1 wherein said second opening in said auxiliaiy layer has flared sidewalls.

5. A method according to claim 1 wherein a deposition speed on side surfaces of the opening is higher than an etching speed.

6. A method according to claim 1 wherein said spacers are formed with a highly selective material with respect to said substrate.

7. A method according to claim 1 wherein said spacers are formed with polymeric organic material.

8. A method according to claim 1 wherein said auxiliary layer comprises organic material.

9. A method according to claim 8 wherein said auxiliary layer comprises polymeric organic material.

10. A method according to claim 9 wherein said layer of polymeric organic material comprises Bottom Anti-Reflection Coating.

* * * * *